US008183458B2

(12) United States Patent
Beck et al.

(10) Patent No.: US 8,183,458 B2
(45) Date of Patent: May 22, 2012

(54) PHOTOVOLTAIC APPARATUS HAVING A FILLER LAYER AND METHOD FOR MAKING THE SAME

(75) Inventors: Markus E. Beck, San Jose, CA (US); Brian Cumpston, Pleasanton, CA (US)

(73) Assignee: Solyndra LLC, Fremont, CA (US)

( * ) Notice: Subject to any disclaimer, the term of this patent is extended or adjusted under 35 U.S.C. 154(b) by 801 days.

(21) Appl. No.: 12/039,659

(22) Filed: Feb. 28, 2008

(65) Prior Publication Data

US 2008/0223442 A1 Sep. 18, 2008

Related U.S. Application Data

(60) Provisional application No. 60/906,901, filed on Mar. 13, 2007.

(51) Int. Cl.
*H01L 31/042* (2006.01)
*H02N 6/00* (2006.01)

(52) U.S. Cl. ........ 136/251; 136/243; 136/256; 136/259; 136/252

(58) Field of Classification Search .................. 136/243, 136/251, 256, 259, 252
See application file for complete search history.

(56) References Cited

U.S. PATENT DOCUMENTS

| | | | |
|---|---|---|---|
| 2,984,775 A | 5/1961 | Matlow et al. |
| 3,005,862 A | 10/1961 | Escoffery |
| 3,046,324 A | 7/1962 | Matlow |
| 3,976,508 A | 8/1976 | Mlavsky |
| 3,990,914 A | 11/1976 | Weinstein et al. |
| 4,078,944 A | 3/1978 | Mlavsky |
| 4,113,531 A | 9/1978 | Zanio et al. |
| 4,217,148 A | 8/1980 | Carlson |
| 4,292,092 A | 9/1981 | Hanak |
| 4,686,323 A | 8/1987 | Biter et al. |
| 4,783,373 A | 11/1988 | Baumeister et al. |
| 4,913,744 A | 4/1990 | Hoegl et al. |
| 5,437,736 A | 8/1995 | Cole |
| 5,902,416 A | 5/1999 | Kern et al. |
| 6,107,564 A | 8/2000 | Aguilera et al. |
| 6,258,620 B1 | 7/2001 | Morel et al. |
| 6,294,723 B2 | 9/2001 | Uematsu et al. |
| 6,355,873 B1 | 3/2002 | Ishikawa |
| 6,359,210 B2 | 3/2002 | Ho et al. |
| 6,410,843 B1 | 6/2002 | Kishi et al. |
| 6,548,751 B2 | 4/2003 | Sverdrup, Jr. et al. |
| 6,555,739 B2 | 4/2003 | Kawam |
| 6,706,959 B2 | 3/2004 | Hamakawa et al. |
| 6,706,963 B2 | 3/2004 | Gaudiana et al. |
| 6,762,359 B2 | 7/2004 | Asai et al. |
| 6,806,414 B2 | 10/2004 | Shiotsuka et al. |
| 6,940,008 B2 | 9/2005 | Shiotsuka et al. |
| 7,235,736 B1 | 6/2007 | Buller et al. |
| 2002/0130311 A1 | 9/2002 | Lieber et al. |
| 2002/0180909 A1 | 12/2002 | Lubart et al. |
| 2003/0121544 A1 | 7/2003 | Hirata et al. |
| 2004/0063320 A1 | 4/2004 | Hollars |
| 2005/0040374 A1 | 2/2005 | Chittibabu et al. |
| 2005/0098202 A1 | 5/2005 | Maltby, Jr. |
| 2006/0086384 A1 | 4/2006 | Nakata |
| 2006/0185714 A1 | 8/2006 | Nam et al. |
| 2007/0079864 A1 | 4/2007 | Gronet |
| 2007/0215195 A1 * | 9/2007 | Buller et al. .................. 136/243 |
| 2007/0215197 A1 | 9/2007 | Buller et al. |
| 2009/0007963 A1 | 1/2009 | Buller et al. |

FOREIGN PATENT DOCUMENTS

| | | |
|---|---|---|
| DE | 32 09 548 | 3/1982 |
| DE | 43 39 547 | 11/1993 |
| DE | 43 43 514 | 12/1993 |
| DE | 44 06 760 | 3/1994 |
| DE | 197 32 876 | 7/1997 |
| FR | 75 30980 | 10/1975 |
| JP | 59-125670 | 7/1984 |
| JP | 59-143377 | 8/1984 |
| JP | 59-144177 | 8/1984 |
| JP | 60 187066 A | 9/1985 |
| JP | 2000 294821 A | 10/2000 |
| WO | WO 84/04425 | 11/1984 |
| WO | WO 2004/001858 A1 | 12/2003 |
| WO | WO 2005/034149 A2 | 4/2004 |
| WO | WO 2004/061417 A2 | 7/2004 |
| WO | WO/2007/002110 | 1/2007 |
| WO | WO 2007/002110 A2 * | 1/2007 |
| WO | WO/2008/060315 | 3/2007 |
| WO | WO/2008/112239 | 3/2008 |
| WO | WO/2008/137141 | 5/2008 |
| WO | WO/2009/042184 | 4/2009 |

OTHER PUBLICATIONS

Birkmire et al., 2005, "Cu(InGa)Se$_2$ Solar Cells on a Flexible Polymer Web," Prog. Photovolt 13: 141-148. Bube, 1998, "Photovoltaic Materials," Properties of Semiconductor Materials 1: 1-277.
Chaisitak et al., 2000, "Improvement in Performances of ZnO:B/i-ZnO/Cu(InGa)Se$_2$ Solar Cells by Surface Treatments for Cu(InGa)Se$_2$," The Japan Society of Applied Physics 39: 1660-1664.
Collares-Pereira et al., 1989, "Amorphous Silicon Photovoltaic Solar Cells—Inexpensive, High-Yield Optical Designs," ASME 111: 112-116.
Cuevas et al., 1982, "50 Per Cent More Output Power from an Albedo-collecting Flat Panel Using Bifacial Solar Cells," Solar Energy 29: 419-420.
Delahoy et al., 2004, "New technologies for CIGS photovoltaics," Solar Energy, 77, pp. 785-793.
Edmonds, 1990, "The Performance of Bifacial Solar Cells in Static Solar Concentrators," Solar Energy Materials 21: 173-190.

(Continued)

*Primary Examiner* — Ling Choi
(74) *Attorney, Agent, or Firm* — Morgan, Lewis & Bockius LLP; Brett Lovejoy

(57) ABSTRACT

Devices for converting light into electric current are provided. A representative device has an encasing structure having at least one portion transparent. The encasing structure is configured to pass light energy into an interior of the encasing structure. The device further has a photovoltaic device positioned within the interior of the encasing structure. The photovoltaic device is positioned to receive light energy. The photovoltaic device is operable to transform the light energy into electric current. The device further has a protective space material, disposed between the encasing structure and the photovoltaic device. The protective space material is operable to transmit the light energy. The protective space material is a non-solid material having a physical property such as a viscosity of less than $1 \times 10^6$ cP and/or a thermal coefficient of expansion of greater than $500 \times 10^{-6}/°C$.

18 Claims, 4 Drawing Sheets

OTHER PUBLICATIONS

Garrison et al., 1983, "Two fixed, evacuate, glass, solar collectors using nonimaging concentration," International Conference on Nonimaging Concentrators, Aug. 25-26, 1983, San Diego, California.

Guillemoles, 2002, "The puzzle of Cu(ln,Ga)Se$_2$ (CIGS) solar cells stability," Thin Solid Films 403-404, pp. 405-409.

Jensen et al., 2003, "Back Contact Cracking During Fabrication of CIGS Solar Cells on Polyimide Substrates," NREL/CD, 877-881.

Joliet et al., 1985, "Laser-induced Synthesis of Thin CuInSe$_2$ Films," Appl. Phys. Lett. 46: 266-267.

Khosrofian et al., 1983, "Measurement of a Gaussian Laser Beam Diameter Through the Direct Inversion of Knife-edge Data," Applied Optics 22: 3406-3410.

Luque, 1984, "Static Concentrators: A Venture to Meet the Low Cost Target in Photovoltaics," Solar Cells 12: 141-145.

Luque, 1984-1985, "Diffusing Reflectors for Bifacial Photovoltaic Panels," Solar Cells 13: 277-292.

Luque et al., 2003, "Handbook of Photovoltaic Science and Engineering," Wiley, 1-662.

Malbranche et al., 2000-2001, "The Three Ways to Exploit Solar Energy," CLEFS CEA No. 44: 25-37.

Miñano 1984, "Design of Static Concentrators with the Receiver Immersed in a Dielectric Tube," $1^{st}$ E.C. Conference on Solar Heating: 599-603.

Miñano et al., 1983, "Design of optimal and ideal 2-D concentrators wit hthe collector immersed in a dielectric tube," Applied Optics 22: 3960-3965.

Miyazaki et al., 2004, "Efficiency Improvement of Cu(InGa)Se$_2$ Thin Film Solar Cells with a High Ga Composition Using Rapid Thermal Annealing," Japanese Journal of Applied Physics, 43, pp. 4244-42547.

Negami et al., 2000, CIGS Solar Cells Using a Novel Window $Zn_{1-x}G_xO$ Film, Photovoltaic Specialists Conference, Conference Record of the Twenty-Eighth IEEE, pp. 634-637.

O'Gallagher et al., 1982, "A new evacuated CPC collector tube," Solar Energy, vol. 29: 575-577.

Otoma et al., 1991, "Growth of CuGaS$_2$ by Alternating-source-feeding MOVPE," Journal of Crystal Growth 115: 807-810.

Pandy et al., 1996, "Handbook of Semiconductor Electrodeposition," Applied Physics: 1-285.

Rojahn et al., 2001, "Photovoltaics on Wire," Mat. Res. Soc. Symp. Proc. 664, pp. A2.1.1-A2.1.6.

Romeo, 2002, "Growth and Characterization of High Efficiency CdTe/CDS Solar Cells," Dissertation submitted to the Swiss Federal Institute of Technology Zurich: 1-103.

Sang et al., 2001, "Performance Improvement of CIGS-based Modules by Depositing High-quality Ga-doped ZnO Windows with Magnetron Sputtering," Solar Energy Materials & Solar Cells 67: 237-245.

Scheidt et al., 2004, "Optical second harmonic imaging of zinc oxide thin films grown by metal organic chemical vapour deposition (MOCVD)", phys. Stat. sol. (c) 1, 9, pp. 2243-2249.

Simpson et al., 2004, "Manufacturing Process Advancements for Flexible CIGS PV on Stainless Foil," Major FY Publications.

Stolt et al., 1994, "CIS Solar Cells with ZnO Windows Deposited by ALE," IEEE, 250-253.

"Tangram Technology Ltd.—Polymer Data File—PMMA" website, http://www.tangram.co.uk/TI-Polymer-PMMA.html from Jan. 12, 2002. Available from www.archive.org. 7 pages.

Trupke, T. et al, "Improving solar cell efficiencies by down-conversion of high-energy photons" J. Appl. Phys. 92, 1668-1674 (2002).

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

Winston et al., 1978, "Two-dimensional concentrators for inhomogeneous media," J. Opt. Society of America vol. 68: 289-291.

Young et al., 2002, "A New Thin-Film CuGaSe$_2$/ Cu(In,Ga)Se$_2$ Bifacial, Tandem Solar Cell with Both Junctions Formed Simultaneously," $29^{th}$ IEEE PV Specialists Conference, New Orleans, Louisiana, May 20-24.

PCT International Search Report and Written Opinion dated Sep. 25, 2008 for PCT/US2007/006615.

PCT International Preliminary Report on Patentability dated Oct. 8, 2008 for PCT/US2007/006615.

PCT International Search Report and Written Opinion dated Sep. 19, 2008 for PCT/US2008/005779.

PCT International Search Report dated Jun. 8, 2009 for PCT/US2008/011133.

PCT International Preliminary Report on Patentability dated Oct. 7, 2009 for PCT/US2008/011133.

PCT International Search Report and Written Opinion dated Dec. 8, 2008 for PCT/US2008/003248.

PCT International Preliminary Report on Patentability dated Mar. 23, 2009 for PCT/US2008/003248.

* cited by examiner

PHOTOVOLTAIC APPARATUS HAVING A FILLER LAYER AND METHOD FOR MAKING THE SAME

CROSS-REFERENCE TO RELATED APPLICATION

This application claims benefit under 35 U.S.C. §119(e), of U.S. Provisional Patent Application No. 60/906,901, filed on Mar. 13, 2007, which is hereby incorporated by reference herein in its entirety.

BACKGROUND

This application is directed to photovoltaic solar cell construction. In particular, it is directed to a protective layer within a housing of a photovoltaic panel or module that surrounds and/or encapsulates the active photovoltaic device within the housing or module.

FIG. 1 is a schematic block diagram of a conventional photovoltaic device. A photovoltaic module 10 can typically have one or more photovoltaic cells 12a-b disposed within it. A photovoltaic cell conventionally is made by having a semiconductor junction 14 disposed between a layer of conducting material 18 and a layer of transparent conducting material 16. Light impinges upon the photovoltaic module 10 and transmits through the transparent conducting material layer 16. Within the semiconductor junction layer 14, the photons interact with the material to produce electron-hole pairs. The semiconductor(s) typically is/are doped creating an electric field extending from the junction layer 14. Accordingly, when the holes and/or electrons are created by the sunlight in the semiconductor, they will migrate depending on the polarity of the device either to the transparent conducting material layer 16 or the conducting material layer 18. This migration creates current within the cell which is routed out of the cell for storage and/or instantaneous use.

One conducting node of the solar cell 12a is shown electrically coupled to an opposite node of another solar cell 12b. In this manner, the current created in one cell may be transmitted to another, where it is eventually collected. The currently depicted apparatus in FIG. 1 is shown where the solar cells are coupled in series, thus creating a higher voltage device. In another manner, (not shown) the solar cells can be coupled in parallel which increases the resulting current rather than the voltage. In any case, the current application is directed to any solar cell apparatus, whether they are electrically coupled in series, in parallel, or any combination thereof.

FIG. 2 is a schematic block diagram of a photovoltaic apparatus. The photovoltaic apparatus has a photovoltaic panel 20, which contains the active photovoltaic devices, such as those described supra. The photovoltaic panel 20 can be made up of one or multiple photovoltaic cells, photovoltaic modules, or other like photovoltaic devices, singly or multiples, solo or in combination with one another. A frame 22 surrounds the outer edge of the photovoltaic panel that houses the active photovoltaic devices. The frame 22 can be disposed flat or at an angle relative to photovoltaic panel 20.

FIG. 3 is a side cross sectional view of the photovoltaic apparatus shown in FIG. 2. In this case, the cross section is taken along the line A-A' shown above in FIG. 2. The photovoltaic panel has a photovoltaic solar device 18 disposed within the frame 22. A glass, plastic, or other translucent barrier 26 is held by the frame 22 to shield the photovoltaic device 18 from an external environment. In some conventional photovoltaic apparatuses, another laminate layer 24 is placed between the photovoltaic device 18 and the translucent barrier 26.

Light impinges through the transparent barrier 26 and strikes the photovoltaic device 18. When the light strikes and is absorbed in the photovoltaic device 18, electricity can be generated much like as described with respect to FIG. 1.

While the transparent barrier 26 is designed to shield the photovoltaic device 18 from an external environment, many times the protection afforded by the transparent barrier 26 is insufficient. In many conventional photovoltaic panels, the transparent barrier 26 is wedged to the frame and bordered by a rubber gasket seal. While the protection of such a seal can be sufficient, the rubber seal will erode and/or decompose over time. Accordingly, portions of the external environment can impinge upon the semiconductor portion of the photovoltaic device 18, diminishing its performance. Further, upon the creation the photovoltaic apparatus, moisture and other contaminants that might be present during the manufacturing process might be present within the space within the frame 22. Again, such moisture and/or other contaminants could interfere with an efficient operation of the photovoltaic device 18.

In some conventional applications, a laminate 24 is placed between the photovoltaic device 18 and the transparent barrier 26. This laminate 24 can be heated so that it melts and affixes to the photovoltaic device 18 as well as the transparent barrier 26, providing further environmental protection for the photovoltaic device 18. One such type of laminate used in photovoltaic apparatuses is ethylene vinyl acetate (EVA). The EVA is applied to the active photovoltaic device, heated and then fused to the device and laminate materials under pressure. At a temperature of about 85° C., the EVA melts and flows into the volume about the photovoltaic device, and at approximately 120-125° C., the EVA starts to crosslink.

It should be noted that the above identified melting process requires many more steps to make the full panel. Further, the heating performed on the laminate requires the photovoltaic device to be subjected at least in part to the applied thermal energy. In some cases this can adversely affect the photovoltaic device itself. Furthermore, the laminate such as EVA has the additional drawback that such materials are frangible. Thus, if there is an accident in which the transparent conduction material 16 or 18 shatters, the laminate layer will also shatter. Accordingly, what is needed in the art are improved layers, disposed between the encasing structure and the photovoltaic device that will prevent shattering and that protect the photovoltaic device.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present disclosure are described herein in the context of a solar cell architecture having a protective layer. Those of ordinary skill in the art will realize that the following detailed description of the present disclosure is illustrative only and is not intended to be in any way limiting. Other embodiments of the present disclosure will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
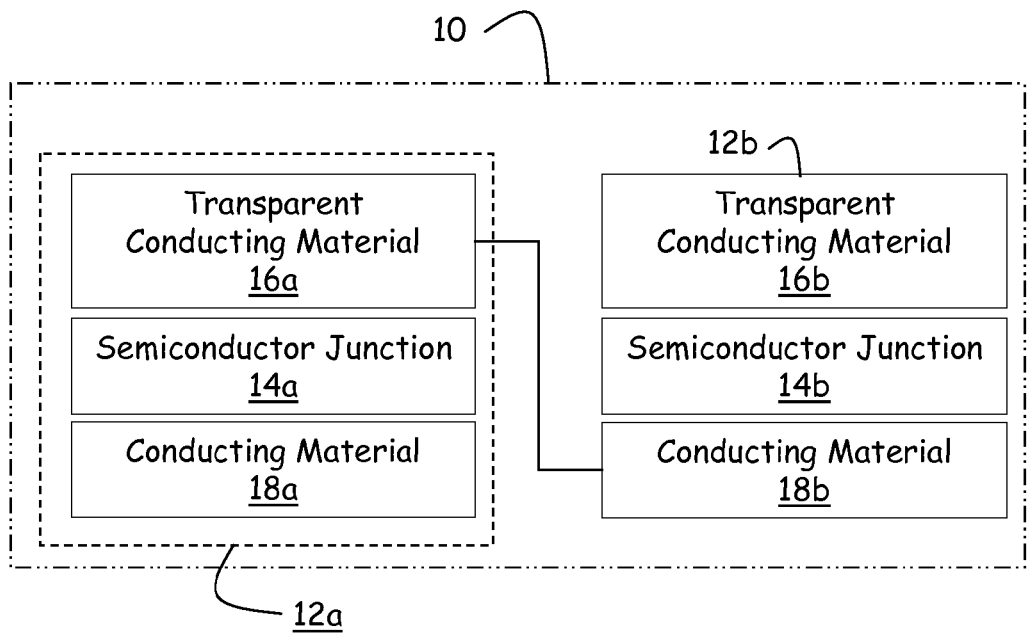
FIG. 1 is a schematic block diagram of a conventional photovoltaic device in accordance with the prior art.
Figure 2:
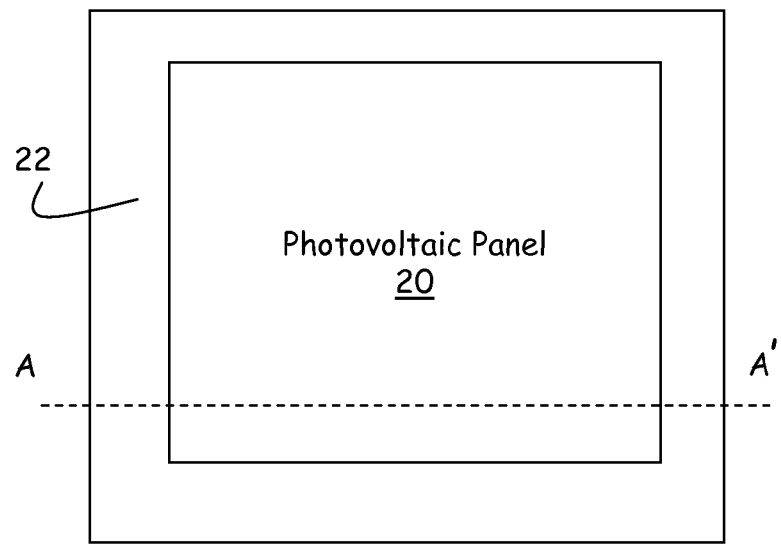
FIG. 2 is a schematic block diagram of a conventional photovoltaic apparatus in accordance with the prior art.
Figure 3:
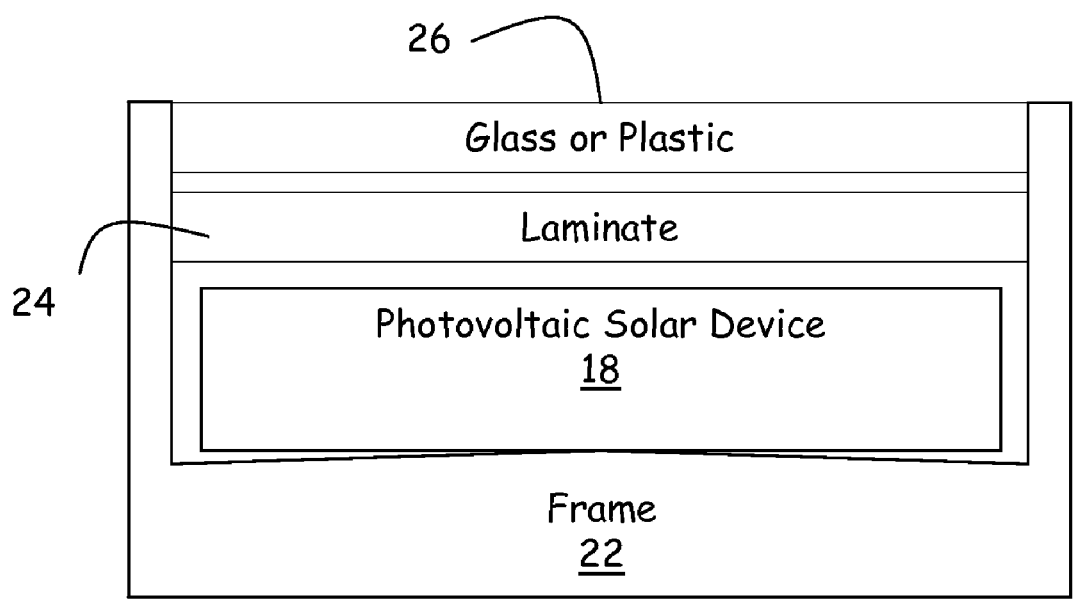
FIG. 3 is a side cross sectional view of the photovoltaic apparatus shown in FIG. 2.
Figure 4:
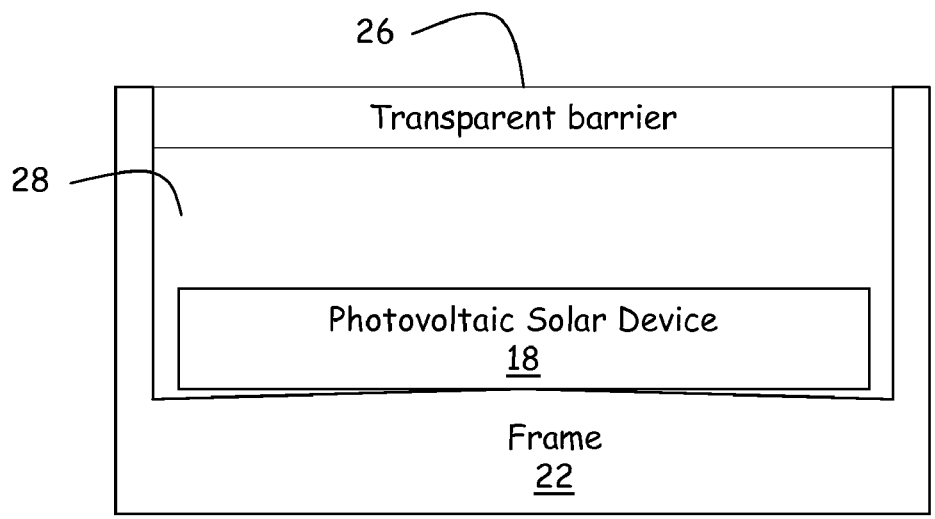
FIG. 4 is cross section of a photovoltaic apparatus having an encapsulation layer.

FIG. 4 is a cross sectional view of a photovoltaic apparatus having a protection space 28. The cross section should be read as also being across the line A-A' shown in FIG. 2. In FIG. 4, the photovoltaic device 18 is disposed within the frame 22, and a transparent barrier 26 is disposed along a face of the photovoltaic panel or module. However, a substance is added to the space between the transparent barrier 26 and the photovoltaic device 18. The substance can flow freely and has a first viscosity $v_0$ during the pouring phase and prior to curing. As the substance is poured into the space between the frame 22, the photovoltaic device 18 and the transparent barrier 26, it settles into the space. Sufficient substance is poured into the space to fully surround the photovoltaic device 18. Accordingly, the photovoltaic apparatus has, after the addition of the substance or mixture, a protection space 28 that surrounds the photovoltaic device 18 and substantially fills the space bounded by the frame 22, the photovoltaic device 18, and the transparent barrier 26. Accordingly, in an embodiment, the substance being added is in liquid form as it is added to the space within the apparatus frame. The substance being added (e.g., an oil) is transparent to light. In some embodiments, the substance is transparent to light if it permits light in the visible spectrum (380 nm to 750 nm) to pass through the substance. In some embodiments, the substance is transparent to light if it permits light in a portion of the visible spectrum (380 nm to 750 nm) to pass through the substance.

The substance forming protection space 28 should be one that provides electrical protection for the semiconductor device, or, have beneficial dielectric properties. In some embodiments, the substance is chosen such that it cures, and such that its has viscosity $v_1$ after the curing phase that is substantially greater that the viscosity $v_0$ during pouring. Thus, the structure of FIG. 4 can be summarized as a photovoltaic module having a frame. Disposed within the frame is a photovoltaic device that converts light into electricity. At least one face of the photovoltaic module is a transparent barrier that allows light to pass to the photovoltaic device, and provides an environmental seal of the interior portion bounded by the frame. Most of the space that is bounded by the photovoltaic device, the frame, and the transparent barrier is filled with a substance. The substance has a first viscosity when added to the space, and a second viscosity, termed an ending viscosity, when cured within a certain period of time. In some embodiments, the ending viscosity (second viscosity), is greater than the initial first viscosity. In some embodiments, the ending viscosity (second viscosity), is the same as the initial first viscosity.

Figure 5:
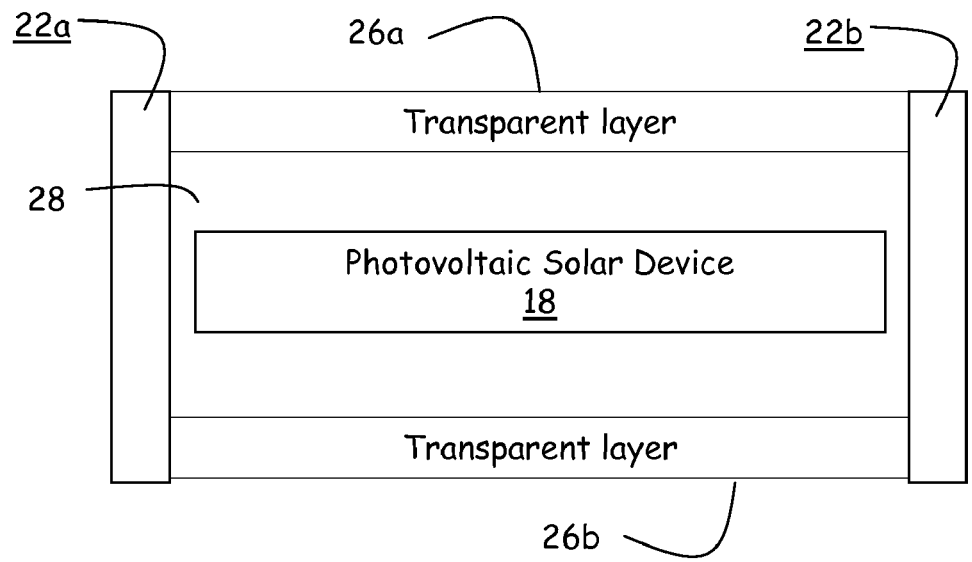
FIG. 5 is a cross section of another photovoltaic apparatus with an encapsulation layer.

FIG. 5 is a cross section of another photovoltaic apparatus having an encapsulation layer. In this embodiment, the frame is a plurality of walls, and the faces are transparent layers 26a-b. The photovoltaic device 18 is disposed within the volume bounded by the walls 22a-b and the transparent barriers 26a-b. In this manner, both faces of the photovoltaic apparatus can accept light, and electricity can be generated by the photovoltaic apparatus from such light entering either the face 26a or the face 2b. In this context, this could be characterized as a bifacial frame for a photovoltaic device.

In the case of embodiments in accordance with FIG. 5, the substance is again poured into the volume bounded by the walls 22a-b and the transparent barrier 26a-b. The substance is poured such that it substantially encapsulates the photovoltaic device 18 thereby filling or partially filling protection space 28. In some embodiments, the substance has a first viscosity $v_0$ during pouring, and a second viscosity $v_1$ (ending viscosity) after the curing phase, where $v_1$ is substantially greater than $v_0$. In some embodiments, the substance has a first viscosity $v_0$ during pouring, and a second viscosity $v_1$ (ending viscosity) after the curing phase, where $v_1$ is identical to $v_0$.

The currently described apparatus can be based on many kinds of geometries, and the method for forming can be applied to all those geometries. This description should be read to encompass those geometries, and should not be restricted in scope to those specific geometries explicitly mentioned.

Figure 6:
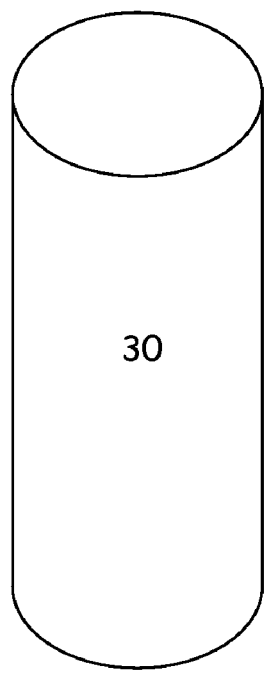
FIG. 6 is a perspective drawing of an elongated or cylindrical photovoltaic apparatus.

FIG. 6 is a perspective drawing of an elongated or cylindrical photovoltaic apparatus. The described structure and method can be applied to this geometry as well.

Figure 7:
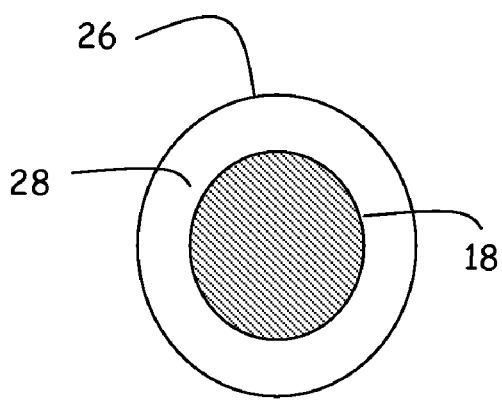
FIG. 7 is a slice schematic diagram of an exemplary photovoltaic apparatus like that shown in FIG. 6, where the slice is taken in a longitudinal orientation perpendicular to a radial axis.

FIG. 7 is a slice schematic diagram of an exemplary photovoltaic apparatus like that shown in FIG. 6, where the slice is taken in a longitudinal orientation perpendicular to a radial axis. The photovoltaic device 18 is disposed within the outer transparent barrier 26. Light impinges upon the structure and is collected at the photovoltaic device 18, where a portion of the light is transformed into electricity. The substance is poured into the space between the photovoltaic device and the transparent barrier 26 thereby filling protection space 28.

Figure 8:
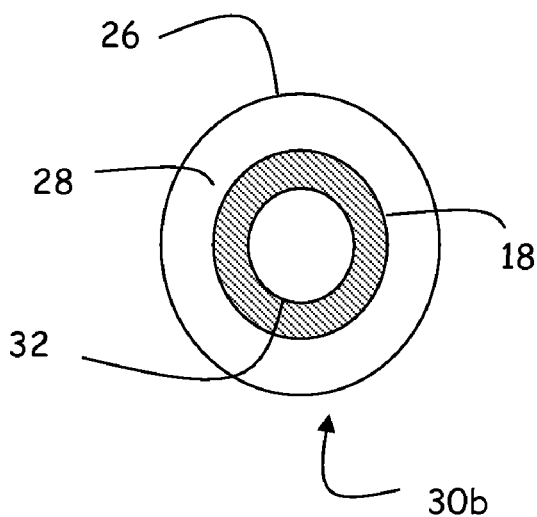
FIG. 8 is a slice schematic diagram of an another exemplary photovoltaic apparatus like that shown in FIG. 6, where the slice is taken in a longitudinal orientation perpendicular to a radial axis.

FIG. 8 is a slice schematic diagram of an another exemplary photovoltaic apparatus like that shown in FIG. 6, where the slice is taken in a longitudinal orientation perpendicular to a radial axis. The photovoltaic device 18 is disposed within the outer transparent barrier 26. The photovoltaic device in this case is tube-like, as opposed to solid-cylindrical. Again, light impinges upon the structure and is collected at the photovoltaic device 18, where a portion of the light is transformed into electricity. The substance is poured into the space between the photovoltaic device and the transparent barrier 26 thereby forming protection space 28.

It should be noted that the many combinations of geometries of framing, transparent barrier, and photovoltaic device are possible. Potential shapes of framing include box-like, angular, having various arcuate features, or having no frames, such as that contemplated in FIGS. 7 and 8. Potential geometries of transparent barriers can include cylindrical, various elongate structures where the radial dimension is far less than the length, panel-like, having arcuate features, box-like, or any potential geometry suited for photovoltaic generation. The photovoltaic devices themselves can be of various geometries, including panels, having arcuate features, elongate, cylindrical, or any potential geometry suited for photovoltaic generation. Again, this description should be interpreted as contemplating those various combinations. This list of combinations and the various sub-lists of potential geometries should be regarded as non-exclusive in nature, and should be treated as exemplary of the various geometries and relationships in which the apparatus could be made or of the various geometries and relationships that to which the method could be employed.

In some embodiments, the photovoltaic device is elongated, having a longitudinal dimension and a width dimension. In some embodiments, the longitudinal dimension is at least four times greater than the width dimension. In other embodiments, the longitudinal dimension is at least five times greater than the width dimension. In yet other embodiments, the longitudinal dimension is at least six times greater than the width dimension. In some embodiments, the longitudinal dimension is 10 cm or greater. In other embodiments, the longitudinal dimension is 50 cm or greater. In some embodiments, the width dimension is 1 cm or greater. In other embodiments, the width dimension is 5 cm or greater. In yet other embodiments, the width dimension is 10 cm or greater. In some embodiments, the elongated substrate is closed at both ends, only at one end, or open at both ends.

In one embodiment, the substance used to occupy protection space 28 comprises a resin or resin-like substance, the resin potentially being added as one component, or added as multiple components that interact with one another to effect a change in viscosity. In another embodiment, the resin can be diluted with a less viscous material, such as a silicon-based oil or liquid acrylates. In these cases, the viscosity of the initial substance can be far less than that of the resin material itself.

In one example, a medium viscosity polydimethylsiloxane mixed with an elastomer-type dielectric gel can be used to occupy protection space 28. In one case, as an example, a mixture of 85% (by weight) Dow Corning 200 fluid, 50 centistoke viscosity (PDMS, polydimethylsiloxane); 7.5% Dow Corning 3-4207 Dielectric Tough Gel, Part A—Resin; and 7.5% Dow Corning 3-4207 Dielectric Tough Gel, Part B—Catalyst is used to form protection space 28. Of course, other oils, gels, or silicones can be used to produce much of what is described in the specification, and accordingly this specification should be read to include those other oils, gels and silicones to generate the described protection space 28. Such oils include silicon based oils, and the gels include many commercially available dielectric gels, to name a few. Curing of silicones can also extend beyond a gel like state. Of course, commercially available dielectric gels and silicones and the various formulations are contemplated as being usable in this application.

In one example, the composition used to form the protection space 28 is 85%, by weight, polydimethylsiloxane polymer liquid, where the polydimethylsiloxane has the chemical formula $(CH_3)_3SiO[SiO(CH_3)_2]_nSi(CH_3)_3$, where n is a range of integers chosen such that the polymer liquid has an average bulk viscosity that falls in the range between 50 centistokes and 100,000 centistokes (all viscosity values given in this application for compositions assume that the compositions are at room temperature). Thus, there may be polydimethylsiloxane molecules in the polydimethylsiloxane polymer liquid with varying values for n provided that the bulk viscosity of the liquid falls in the range between 50 centistokes and 100,000 centistokes. Bulk viscosity of the polydimethylsiloxane polymer liquid may be determined by any of a number of methods known to those of skill in the art, such as by using a capillary viscometer. Further, the composition includes 7.5%, by weight, of a silicone elastomer comprising at least sixty percent, by weight, dimethylvinyl-terminated dimethyl siloxane (CAS number 68083-19-2) and between 3 and 7 percent by weight silicate (New Jersey TSRN 14962700-537 6P). Further, the composition includes 7.5%, by weight, of a silicone elastomer comprising at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6).

In one example, the composition used to form the protection space 28 is silicone oil mixed with a dielectric gel. The silicone oil is a polydimethylsiloxane polymer liquid, whereas the dielectric gel is a mixture of a first silicone elastomer and a second silicone elastomer. As such, the composition used to form the filler layer 330 is X %, by weight, polydimethylsiloxane polymer liquid, Y %, by weight, a first silicone elastomer, and Z %, by weight, a second silicone elastomer, where X, Y, and Z sum to 100. Here, the polydimethylsiloxane polymer liquid has the chemical formula $(CH_3)_3SiO[SiO(CH_3)_2]_nSi(CH_3)_3$, where n is a range of integers chosen such that the polymer liquid has an average bulk viscosity that falls in the range between 50 centistokes and 100,000 centistokes. Thus, there may be polydimethylsiloxane molecules in the polydimethylsiloxane polymer liquid with varying values for n provided that the bulk viscosity of the liquid falls in the range between 50 centistokes and 100,000 centistokes. The first silicone elastomer comprises at least sixty percent, by weight, dimethylvinyl-terminated dimethyl siloxane (CAS number 68083-19-2) and between 3 and 7 percent by weight silicate (New Jersey TSRN 14962700-537 6P). Further, the second silicone elastomer comprises at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6). In this embodiment, X may range between 30 and 90, Y may range between 2 and 20, and Z may range between 2 and 20, provided that X, Y and Z sum to 100 percent.

In another example, the composition used to form the protection space is silicone oil mixed with a dielectric gel. The silicone oil is a polydimethylsiloxane polymer liquid, whereas the dielectric gel is a mixture of a first silicone elastomer and a second silicone elastomer. As such, the composition used to form the filler layer 330 is X %, by weight, polydimethylsiloxane polymer liquid, Y %, by weight, a first silicone elastomer, and Z %, by weight, a second silicone elastomer, where X, Y, and Z sum to 100. Here, the polydimethylsiloxane polymer liquid has the chemical formula $(CH_3)_3SiO[SiO(CH_3)_2]_nSi(CH_3)_3$, where n is a range of integers chosen such that the polymer liquid has a volumetric thermal expansion coefficient of at least $500 \times 10^{-6}/^\circ C$. Thus, there may be polydimethylsiloxane molecules in the polydimethylsiloxane polymer liquid with varying values for n provided that the polymer liquid has a volumetric thermal expansion coefficient of at least $960 \times 10^{-6}/°$ C. The first silicone elastomer comprises at least sixty percent, by weight, dimethylvinyl-terminated dimethyl siloxane (CAS number 68083-19-2) and between 3 and 7 percent by weight silicate (New Jersey TSRN 14962700-537 6P). Further, the second silicone elastomer comprises at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6). In this embodiment, X may range between 30 and 90, Y may range between 2 and 20, and Z may range between 2 and 20, provided that X, Y and Z sum to 100 percent.

In the present disclosure, a composition used to occupy the protection space 28 that is bounded by the photovoltaic device 18, the frame 22, and the transparent barrier 26 and this material is termed the protective space material. In some embodiments, the protective space material occupies at least 50% of the total volume of the protection space 28, at least 60% of the total volume of the protection space 28, at least 70% of the total volume of the protection space 28, at least 80% of the total volume of the protection space 28, or at least 90% of the total volume of the protection space 28, where the balance of the volume is a gas such as air.

In some embodiments, the composition used to occupy the protection space 28 ("the protective space material") is a crystal clear silicon oil mixed with a dielectric gel. In some embodiments, the protective space material has a volumetric thermal coefficient of expansion of greater than $250 \times 10^{-6}/°$ C., greater than $300 \times 10^{-6}/°$ C., greater than $400 \times 10^{-6}/°$ C., greater than $500 \times 10^{-6}/°$ C., greater than $1000 \times 10^{-6}/°$ C., greater than $2000 \times 10^{-6}/°$ C., greater than $5000 \times 10^{-6}/°$ C., or between $250 \times 10^{-6}/°$ C. and $10000 \times 10^{-6}/°$ C. In some embodiments, the protective material has an adhesion of more than 9.8 m/seconds$^2$. The protective space materials of the present disclosure are advantageous over the prior art because they have a tackness that allows them to adhere to the transparent layer 26 such that, were the transparent layer to shatter, the adhesive bonds between the protective space material and the transparent layer 26 shards would prevent the shards from scattering and causing harm to subjects.

In some embodiments, a silicone-based dielectric gel can be used in-situ. The dielectric gel can also be mixed with a silicone based oil to reduce both beginning and ending viscosities. The ratio of silicone-based oil by weight in the mixture can be varied. The percentage of silicone-based oil by weight in the mixture of silicone-based oil and silicone-based dielectric gel can have values at or about (e.g. ±2.5%) 25%, 30%, 35%, 40%, 45%, 50%, 55%, 60%, 65%, 70%, 75%, and 85%. Ranges of 20%-30%, 25%-35%, 30%-40%, 35%-45%, 40%-50%, 45%-55%, 50%-60%, 55%-65%, 60%-70%, 65%-75%, 70%-80%, 75%-85%, and 80%-90% (by weight) are also contemplated. Further, these same ratios by weight can be contemplated for the mixture when using other types of oils or acrylates instead of or in addition to silicon-based oil to lessen the beginning viscosity of the gel mixture alone.

The initial viscosity of the mixture of 85% Dow Corning 200 fluid, 50 centistoke viscosity (PDMS, polydimethylsiloxane); 7.5% Dow Corning 3-4207 Dielectric Tough Gel, Part A—Resin 7.5% Dow Corning 3-4207 Dielectric Tough Gel, Part B—Pt Catalyst is approximately 100 centipoise (cP). Beginning viscosities of less than 1, less than 5, less than 10, less than 25, less than 50, less than 100, less than 250, less than 500, less than 750, less than 1000, less than 1200, less than 1500, less than 1800, and less than 2000 cP are imagined, and any beginning viscosity in the range 1-2000 cP is acceptable. Other ranges can include 1-10 cP, 10-50 cP, 50-100 cP, 100-250 cP, 250-500 cP, 500-750 cP, 750-1000 cP, 800-1200 cP, 1000-1500 cP, 1250-1750 cP, 1500-2000 cP, and 1800-2000 cP. In some cases an initial viscosity between 1000 cP and 1500 cP can also be used.

A final viscosity for the protection space 28 of well above the initial viscosity is envisioned in some embodiments. In most cases, a ratio of the final viscosity to the beginning viscosity is at least 50:1. With lower beginning viscosities, the ratio of the final viscosity to the beginning viscosity may be 20,000:1, or in some cases, up to 50,000:1. In most cases, a ratio of the final viscosity to the beginning viscosity of between 5,000:1 to 20,000:1, for beginning viscosities in the 10 cP range, may be used. For beginning viscosities in the 1000 cP range, ratios of the final viscosity to the beginning viscosity between 50:1 to 200:1 are imagined. In short order, ratios in the ranges of 200:1 to 1,000:1, 1,000:1 to 2,000:1, 2,000:1 to 5,000:1, 5,000:1 to 20,000:1, 20,000:1 to 50,000:1, 50,000:1 to 100,000:1, 100,000:1 to 150,000:1, and 150,000:1 to 200,000:1 are contemplated.

The final viscosity of the protection space 28 is typically on the order of 50,000 cP to 200,000 cP. In some cases, a final viscosity of at least $1 \times 10^6$ cP is envisioned. Final viscosities of at least 50,000 cP, at least 60,000 cP, at least 75,000 cP, at least 100,000 cP, at least 150,000 cP, at least 200,000 cP, at least 250,000 cP, at least 300,000 cP, at least 500,000 cP, at least 750,000 cP, at least 800,000 cP, at least 900,000 cP, and at least $1 \times 10^6$ cP are all envisioned. Ranges of final viscosity for the encapsulation layer can include 50,000 cP to 75,000 cP, 60,000 cP to 100,000 cP, 75,000 cP to 150,000 cP, 100,000 cP to 200,000 cP, 100,000 cP to 250,000 cP, 150,000 cP to 300,000 cP, 200,000 cP to 500,000 cP, 250,000 cP to 600,000 cP, 300,000 cP to 750,000 cP, 500,000 cP to 800,000 cP, 600,000 cP to 900,000 cP, and 750,000 cP to $1 \times 10^6$ cP.

Curing temperatures can be numerous, with a common curing temperature of room temperature. With this in mind, the curing step need not involve adding thermal energy to the system. Temperatures that can be used for curing can be envisioned (with temperatures in degrees F.) at up to 60 degrees, up to 65 degrees, up to 70 degrees, up to 75 degrees, up to 80 degrees, up to 85 degrees, up to 90 degrees, up to 95 degrees, up to 100 degrees, up to 105 degrees, up to 110 degrees, up to 115 degrees, up to 120 degrees, up to 125 degrees, and up to 130 degrees, and temperatures generally between 55 and 130 degrees. Other curing temperature ranges can include 60-85 degrees, 70-95 degrees, 80-110 degrees, 90-120 degrees, and 100-130 degrees. It should be noted that all these individual temperatures and ranges are less than that needed to crosslink EVA.

The working time of the substance of a mixture can be varied as well. The working time of a mixture in this context means the time for the substance (e.g., the substance used to form the protective space material 28) to cure to a viscosity more than double the initial viscosity when mixed. Working time for the layer can be varied. In particular, working times of less than 5 minutes, on the order of 10 minutes, up to 30 minutes, up to 1 hour, up to 2 hours, up to 4 hours, up to 6 hours, up to 8 hours, up to 12 hours, up to 18 hours, and up to 24 hours are all contemplated. A working time of 1 day or less is found to be best in practice. Any working time between 5 minutes and 1 day is acceptable.

In context of this disclosure, resin can mean both synthetic and natural substances that have a viscosity prior to curing and a greater viscosity after curing. The resin can be unitary in nature, or may be derived from the mixture of two other substances to form the resin.

In yet another embodiment the protection space 28 may comprise solely a liquid. In one case the filler layer may be a dielectric oil. Such dielectric oils may be silicone-based. In one example, the oil can be 85% Dow Corning 200 fluid, 50 centistoke viscosity (PDMS, polydimethylsiloxane), One will realize that many differing oils can be used in place of polydimethylsiloxane, and this application should be read to include such other similar dielectric oils having the proper optical properties. Ranges of bulk viscosity of the oil by itself can range from include 1-1 centistokes, 1-5 centistokes, 5-10 centistokes, 10-25 centistokes, 25-50 centistokes, 40-60 centistokes, 50-75 centistokes, 75-100 centistokes, and 80-120 centistokes. Ranges between each of the individual points mentioned in this paragraph are also contemplated.

In some embodiments the material in the protection space 28 has a viscosity of less than $1\times10^6$ cP. In some embodiments, the material in the protection space 28 has a thermal coefficient of expansion of greater than $500\times10^{-6}/^\circ$ C. or greater than $1000\times10^{-6}/^\circ$ C. In some embodiments, the material in the protection space 28 comprises epolydimethylsiloxane polymer. In some embodiments, the material in the protection space 28 comprises by weight: less than 50% of a dielectric gel or components to form a dielectric gel; and at least 30% of a silicone oil, the silicone oil having a beginning viscosity of no more than half of the beginning viscosity of the dielectric gel or components to form the dielectric gel. In some embodiments, the material in the protection space 28 has a thermal coefficient of expansion of greater than $500\times10^{-6}/^\circ$ C. and comprises by weight: less than 50% of a dielectric gel or components to form a dielectric gel; and at least 30% of a silicone oil. In some embodiments, the material in the protection space 28 is formed from silicone oil mixed with a dielectric gel. In some embodiments, the silicone oil is a polydimethylsiloxane polymer liquid and the dielectric gel is a mixture of a first silicone elastomer and a second silicone elastomer. In some embodiments, the material in the protection space 28 is formed from X %, by weight, polydimethylsiloxane polymer liquid, Y %, by weight, a first silicone elastomer, and Z %, by weight, a second silicone elastomer, where X, Y, and Z sum to 100. In some embodiments, the polydimethylsiloxane polymer liquid has the chemical formula $(CH_3)_3SiO[SiO(CH_3)_2]_nSi(CH_3)_3$, where n is a range of integers chosen such that the polymer liquid has an average bulk viscosity that falls in the range between 50 centistokes and 100,000 centistokes. In some embodiments, first silicone elastomer comprises at least sixty percent, by weight, dimethylvinyl-terminated dimethyl siloxane and between 3 and 7 percent by weight silicate. In some embodiments, the second silicone elastomer comprises: (i) at least sixty percent, by weight, dimethylvinyl-terminated dimethyl siloxane; (ii) between ten and thirty percent by weight hydrogen-terminated dimethyl siloxane; and (iii) between 3 and 7 percent by weight trimethylated silica. In some embodiments, X is between 30 and 90; Y is between 2 and 20; and Z is between 2 and 20.

In some embodiments, the material in the protection space 28 comprises a silicone gel composition, comprising: (A) 100 parts by weight of a first polydiorganosiloxane containing an average of at least two silicon-bonded alkenyl groups per molecule and having a viscosity of from 0.2 to 10 Pa·s at 25° C.; (B) at least about 0.5 part by weight to about 10 parts by weight of a second polydiorganosiloxane containing an average of at least two silicone-bonded alkenyl groups per molecule, where the second polydiorganosiloxane has a viscosity at 25° C. of at least four times the viscosity of the first polydiorganosiloxane at 25° C.; (C) an organohydrogensiloxane having the average formula $R_7Si(SiOR^8{}_2H)_3$ wherein $R^7$ is an alkyl group having 1 to 18 carbon atoms or aryl, $R^8$ is an alkyl group having 1 to 4 carbon atoms, in an amount sufficient to provide from 0.1 to 1.5 silicone-bonded hydrogen atoms per alkenyl group in components (A) and (B) combined; and (D) a hydrosilylation catalyst in an amount sufficient to cure the composition as disclosed in U.S. Pat. No. 6,169,155, which is hereby incorporated by reference herein in its entirety. In fact, any of the compounds disclosed in U.S. Pat. No. 6,169,155, which is hereby incorporated by reference herein in its entirety, can be used to occupy all or a portion of protection space 28.

In context, the above-described photovoltaic device can be made of various substrates, and in any variety of manners. Examples of compounds that can be used to produce the semiconductor photovoltaic cell can include Group IV elemental semiconductors such as: carbon (C), silicon (Si) (both amorphous and crystalline), germanium (Ge); Group IV compound semiconductors, such as: silicon carbide (SiC), silicon germanide (SiGe); Group III-V semiconductors, such as: aluminum antimonide (AlSb), aluminum, arsenide (AlAs), aluminum nitride (AlN), aluminum phosphide (AlP), boron nitride (BN), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP); Group III-V ternary semiconductor alloys, such as: aluminum gallium arsenide (AlGaAs, AlxGa1-xAs), indium gallium arsenide (InGaAs, InxGa1-xAs), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb); Group III-V quaternary semiconductor alloys, such as: aluminum gallium indium phosphide (AlGaInP, also InAlGaP, InGaAlP, AlInGaP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN); Group III-V quinary semiconductor alloys, such as: gallium indium nitride arsenide antimonide (GaInNAsSb); Group II-VI semiconductors, such as: cadmium selenide (CdSe), cadmium sulfide (CdS), cadmium telluride (CdTe), zinc oxide (ZnO), zinc selenide (ZnSe), zinc sulfide (ZnS), zinc telluride (ZnTe); Group II-VI ternary alloy semiconductors, such as: cadmium zinc telluride (CdZnTe, CZT), mercury cadmium telluride (HgCdTe), mercury zinc telluride (HgZnTe), mercury zinc selenide (HgZnSe); Group I-VII semiconductors, such as: cuprous chloride (CuCl); Group IV-VI semiconductors, such as: lead selenide (PbSe), lead sulfide (PbS), lead telluride (PbTe), tin sulfide (SnS), tin telluride (SnTe); Group IV-VI ternary semiconductors, such as: lead tin telluride (PbSnTe), thallium tin telluride ($Tl_2SnTe_5$), thallium germanium telluride ($Tl_2GeTe_5$); Group V-VI semiconductors, such as: bismuth telluride ($Bi_2Te_3$); Group II-V semiconductors, such as: cadmium phosphide ($Cd_3P_2$), cadmium arsenide ($Cd_3As_2$), cadmium antimonide ($Cd_3Sb_2$), zinc phosphide ($Zn_3P_2$), zinc arsenide ($Zn_3As_2$), zinc antimonide ($Zn_3Sb_2$); layered semiconductors, such as: lead(II) iodide ($PbI_2$), molybdenum disulfide ($MoS_2$), gallium selenide (GaSe), tin sulfide (SnS), bismuth sulfide ($Bi_2S_3$); others, such as: copper indium gallium selenide (CIGS), platinum silicide (PtSi), bismuth(III) iodide (BiI$_3$), mercury(II) iodide (HgI$_2$), thallium(I) bromide (TlBr); or miscellaneous oxides, such as: titanium dioxide anatase (TiO$_2$), copper(I) oxide (Cu$_2$O), copper(II) oxide (CuO), uranium dioxide (UO$_2$), or Uranium trioxide (UO$_3$). This listing is not exclusive, but exemplary in nature. Further, the individual grouping lists are also exemplary and not exclusive. Accordingly, this description of the potential semiconductors that can be used in the photovoltaic should be regarded as illustrative.

The foregoing materials may be used with various dopings to a form semiconductor junction. For example, a layer of silicon can be doped with an element or substance, such that when the doping material is added, it takes away (accepts) weakly-bound outer electrons, and increases the number of free positive charge carriers (e.g. a p-type semiconductor.) Another layer can be doped with an element or substance, such that when the doping material is added, it gives (donates) weakly-bound outer electrons addition and increases the number of free electrons (e.g. an n-type semiconductor.) An intrinsic semiconductor, also called an undoped semiconductor or i-type semiconductor, can also be used. This intrinsic semiconductor is typically a pure semiconductor without any significant doping. The intrinsic semiconductor, also called an undoped semiconductor or i-type semiconductor, is a pure semiconductor without any significant dopants present. The semiconductor junction layer can be made from various combinations of p-, n-, and i-type semiconductors, and this description should be read to include those combinations.

The photovoltaic device may be made in various ways and have various thicknesses. The photovoltaic device as described herein may be a so-called thick-film semiconductor structure or a so-called thin-film semiconductor structure as well.

In an embodiment, a device for converting light into electric current is contemplated. The device has encasing structure having at least one portion transparent and capable of passing light energy into an interior defined by the sides of the encasing structure. A means for converting light into electric current is disposed within the interior of the encasing structure, and positioned to receive the light energy entering it. The means for converting light into electric current catches the incoming light and transforms it into electric current. A protective space material is disposed between the encasing structure and the means for converting light into electric current, where the protective space material can transmit the light energy. The protective space material is a non-solid material having a viscosity less than $1\times10^6$ cP. In another embodiment, the protective space material is made of at least partly from an elastomer gel. In one embodiment, the means for converting light into electric current is a semiconductor-based photovoltaic cell.

A method for making a device for converting light into electric current is also contemplated. The method comprises a step of providing an encasing structure having an interior volume. A step of providing a means for within the encasing structure is also contemplated. A substance in is poured into the encasing structure and cured in situ within the encasing structure. In one embodiment, the substance has a viscosity of less than 50,000 cP a time when it is being poured into the encasing structure. In further extension, the substance is cured such that the viscosity of the substance after curing is over 50,000 cP at a time $t_2$. The time $t_2$ is contemplated to be a time over 1 minute from the end of the pouring. In yet another embodiment, the step of curing takes place at a temperature less than 125 degrees Fahrenheit.

In some embodiments, photovoltaic device 18 comprises a rigid substrate. In some embodiments, all or a portion of the substrate is rigid. Rigidity of a material can be measured using several different metrics including, but not limited to, Young's modulus. In solid mechanics, Young's Modulus (E) (also known as the Young Modulus, modulus of elasticity, elastic modulus or tensile modulus) is a measure of the stiffness of a given material. It is defined as the ratio, for small strains, of the rate of change of stress with strain. This can be experimentally determined from the slope of a stress-strain curve created during tensile tests conducted on a sample of the material. Young's modulus for various materials is given in the following table:

| Material | Young's modulus (E) in GPa | Young's modulus (E) in lbf/in$^2$ (psi) |
| --- | --- | --- |
| Rubber (small strain) | 0.01-0.1 | 1,500-15,000 |
| Low density polyethylene | 0.2 | 30,000 |
| Polypropylene | 1.5-2 | 217,000-290,000 |
| Polyethylene terephthalate | 2-2.5 | 290,000-360,000 |
| Polystyrene | 3-3.5 | 435,000-505,000 |
| Nylon | 3-7 | 290,000-580,000 |
| Aluminum alloy | 69 | 10,000,000 |
| Glass (all types) | 72 | 10,400,000 |
| Brass and bronze | 103-124 | 17,000,000 |
| Titanium (Ti) | 105-120 | 15,000,000-17,500,000 |
| Carbon fiber reinforced plastic (unidirectional, along grain) | 150 | 21,800,000 |
| Wrought iron and steel | 190-210 | 30,000,000 |
| Tungsten (W) | 400-410 | 58,000,000-59,500,000 |
| Silicon carbide (SiC) | 450 | 65,000,000 |
| Tungsten carbide (WC) | 450-650 | 65,000,000-94,000,000 |
| Single Carbon nanotube | 1,000+ | 145,000,000 |
| Diamond (C) | 1,050-1,200 | 150,000,000-175,000,000 |

In some embodiments of the present application, a material (e.g., a substrate) is deemed to be rigid when it is made of a material that has a Young's modulus of 20 GPa or greater, 30 GPa or greater, 40 GPa or greater, 50 GPa or greater, 60 GPa or greater, or 70 GPa or greater. In some embodiments of the present application a material (e.g., a substrate) is deemed to be rigid when Young's modulus for the material is a constant over a range of strains. Such materials are called linear, and are said to obey Hooke's law. Thus, in some embodiments, a substrate is made out of a linear material that obeys Hooke's law. Examples of linear materials include steel, carbon fiber, and glass. Rubber and soil (except at very low strains) are non-linear materials. In some embodiments, a material is considered rigid when it adheres to the small deformation theory of elasticity, when subjected to any amount of force in a large range of forces (e.g., between 1 dyne and $10^5$ dynes, between 1000 dynes and $10^6$ dynes, between 10,000 dynes and $10^7$ dynes), such that the material only undergoes small elongations or shortenings or other deformations when subject to such force. The requirement that the deformations (or gradients of deformations) of such exemplary materials are small means, mathematically, that the square of either of these quantities is negligibly small when compared to the first power of the quantities when exposed to such a force. Another way of stating the requirement for a rigid material is that such a material, over a large range of forces (e.g., between 1 dyne and $10^5$ dynes, between 1000 dynes and $10^6$ dynes, between 10,000 dynes and $10^7$ dynes), is well characterized by a strain tensor that only has linear terms. The strain tensor for materials is described in Borg, 1962, *Fundamentals of Engineering Elasticity*, Princeton, N.J., pp. 36-41, which is hereby incorporated by reference herein in its entirety. In some embodiments, a material is considered rigid when a sample of the material of sufficient size and dimensions does not bend under the force of gravity.

Thus, a photovoltaic apparatus having an active photovoltaic device substantially encapsulated in a non-solid protective space material is described and illustrated. Those skilled in the art will recognize that many modifications and variations of the present invention are possible without departing from the invention. Of course, the various features depicted in each of the figures and the accompanying text may be combined together.

Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to these skilled in the art having the benefit of this disclosure that many more modifications than mentioned above are possible without departing from the inventive concepts herein. The invention, therefore, is not to be restricted except in the spirit of the appended claims.

What is claimed:

1. A device for converting light into electric current, the device comprising:
    an elongated encasing structure, the encasing structure having a first portion transparent and capable of passing light energy into an interior of the encasing structure, the first portion having at least one arcuate component;
    a photovoltaic device positioned within the interior of the encasing structure, and positioned to receive the light energy, the photovoltaic device operable to transform the light energy into electric current, wherein the photovoltaic device comprises a substrate having a Young's modulus of 20 GPa or greater; and
    a protective space material, disposed between the encasing structure and the photovoltaic device and operable to transmit the light energy, the protective space material comprising an elastomer gel, wherein the protective space material only partially fills a volume disposed between the encasing structure and the photovoltaic device.

2. The device of claim 1, wherein all or a portion of said substrate has a Young's modulus of 40 GPa or greater.

3. A device for converting light into electric current, the device comprising:
    an elongated encasing structure, the encasing structure having a first portion transparent and capable of passing light energy into an interior of the encasing structure, the first portion having at least one arcuate component;
    a means for producing electricity from light energy disposed within the interior of the encasing structure, and positioned to receive the light energy, the means for producing electricity operable to transform the light energy into electric current, wherein the means for producing electricity comprises a substrate having a Young's modulus of 20 GPa or greater; and
    a protective space material, disposed between the encasing structure and the photovoltaic device and operable to transmit the light energy, the protective space material comprising a gel, wherein the protective space material only partially fills a volume disposed between the encasing structure and the photovoltaic device.

4. The device of claim 3, wherein all or a portion of the substrate has a Young's modulus of 40 GPa or greater.

5. A device for converting light into electric current, the device comprising:
    an elongated encasing structure, the encasing structure having a first portion transparent and capable of passing light energy into an interior of the encasing structure, the encasing structure being substantially circular in cross section;
    a photovoltaic device positioned within the interior of the encasing structure, and positioned to receive the light energy, the photovoltaic device operable to transform the light energy into electric current, wherein the photovoltaic device comprises a substrate having a Young's modulus of 20 GPa or greater; and
    a protective space material, disposed between the encasing structure and the photovoltaic device and operable to transmit the light energy, the protective space material being a non-solid material having an ending viscosity less than $1 \times 10^6$ cP, wherein the protective space material only partially fills a volume disposed between the encasing structure and the photovoltaic device.

6. The device of claim 5, wherein said all or a portion of the substrate has a Young's modulus of 40 GPa or greater.

7. A device for converting light into electric current, the device comprising:
    an elongated encasing structure, the encasing structure having a first portion transparent and capable of passing light energy into an interior of the encasing structure, the encasing structure being substantially circular in cross section;
    a photovoltaic device positioned within the interior of the encasing structure, and positioned to receive the light energy, the photovoltaic device operable to transform the light energy into electric current, wherein the photovoltaic device comprises a substrate having a Young's modulus of 20 GPa or greater; and
    a protective space material, disposed between the encasing structure and the photovoltaic device and operable to transmit the light energy, the protective space material comprising an elastomer gel, wherein the protective space material only partially fills a volume disposed between the encasing structure and the photovoltaic device.

8. The device of claim 7, wherein said all or a portion of the substrate has a Young's modulus of 40 GPa or greater.

9. A device for converting light into electric current, the device comprising:
    an elongated encasing structure, the encasing structure having a first portion transparent and capable of passing light energy into an interior of the encasing structure, the encasing structure being substantially circular in cross section;
    a means for producing electricity from light energy disposed within the interior of the encasing structure, and positioned to receive the light energy, the means for producing electricity operable to transform the light energy into electric current, wherein the means for producing electricity from light energy comprises a substrate having a Young's modulus of 20 GPa or greater; and
    a protective space material layer, disposed between the encasing structure and the photovoltaic device and operable to transmit the light energy, the protective space material comprising a gel, wherein the protective space material only partially fills a volume disposed between the encasing structure and the photovoltaic device.

10. The device of claim 9, wherein said all or a portion of the substrate has a Young's modulus of 40 GPa or greater.

11. A device for converting light into electric current, the device comprising:
- an elongated encasing structure, the encasing structure having a first portion transparent and capable of passing light energy into an interior of the encasing structure, the encasing structure being substantially circular in cross section;
- a photovoltaic device positioned within the interior of the encasing structure, and positioned to receive the light energy, the photovoltaic device operable to transform the light energy into electric current;
- a protective space material, disposed between the encasing structure and the photovoltaic device and operable to transmit the light energy, the protective space material being a non-solid material having an ending viscosity less than $1 \times 10^6$ cP, and the protective space material comprising:
  - a silicon-based dielectric gel; and
  - a silicon-based oil, wherein
- the protective space material only partially fills a volume disposed between the encasing structure and the photovoltaic device.

12. The device of claim 11 wherein an amount of silicon-based oil in the protective space material is greater than 50% by weight.

13. The device of claim 11, wherein the photovoltaic device comprises a substrate, wherein all or a portion of the substrate has a Young's modulus of 40 GPa or greater.

14. The device of claim 11, wherein said all or a portion of the substrate has a Young's modulus of 40 GPa or greater.

15. A device for converting light into electric current, the device comprising:
- an elongated encasing structure, the encasing structure having a first portion transparent and capable of passing light energy into an interior of the encasing structure, the encasing structure being substantially circular in cross section;
- a photovoltaic device positioned within the interior of the encasing structure, and positioned to receive the light energy, the photovoltaic device operable to transform the light energy into electric current; and
- a protective space material, disposed between the encasing structure and the photovoltaic device and operable to transmit the light energy, the protective space material comprising a gel, the gel comprising:
  - a silicon-based dielectric gel; and
  - a silicon-based oil, wherein
- the protective space material only partially fills a volume disposed between the encasing structure and the photovoltaic device.

16. The device of claim 15, wherein the amount of silicon-based oil in the protective space material is greater than 50% by weight.

17. The device of claim 15, wherein the photovoltaic device comprises a substrate, wherein all or a portion of the substrate has a Young's modulus of 20 GPa or greater.

18. The device of claim 15, wherein said all or a portion of the substrate has a Young's modulus of 40 GPa or greater.

* * * * *